US012041856B2

(12) United States Patent
Lauer et al.

(10) Patent No.: US 12,041,856 B2
(45) Date of Patent: Jul. 16, 2024

(54) SUPERCONDUCTING CIRCUIT PROVIDED ON AN ENCAPSULATED VACUUM CAVITY

(71) Applicant: International Business Machines Corporation, Armonk, NY (US)

(72) Inventors: Isaac Lauer, Chappaqua, NY (US); Karthik Balakrishnan, Scarsdale, NY (US); Jeffrey Sleight, Ridgefield, CT (US); David James Frank, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/037,191

(22) Filed: Sep. 29, 2020

(65) Prior Publication Data

US 2022/0102613 A1 Mar. 31, 2022

(51) Int. Cl.
| | |
|---|---|
| H01L 23/02 | (2006.01) |
| H10N 60/01 | (2023.01) |
| H10N 60/81 | (2023.01) |
| H10N 60/83 | (2023.01) |
| H10N 69/00 | (2023.01) |
| H01L 21/56 | (2006.01) |

(52) U.S. Cl.
CPC ............ *H10N 60/01* (2023.02); *H10N 60/81* (2023.02); *H10N 60/83* (2023.02); *H10N 69/00* (2023.02); *H01L 21/56* (2013.01)

(58) Field of Classification Search
CPC ......... H01L 39/24; H01L 27/18; H01L 39/04; H01L 39/08; H01L 21/56; H10N 60/01; H10N 60/81; H10N 60/83; H10N 69/00; H10N 60/80
See application file for complete search history.

(56) References Cited

U.S. PATENT DOCUMENTS

| 7,507,634 B2 | 3/2009 | Sato et al. |
| 7,705,701 B2 | 4/2010 | Huang et al. |
| 2019/0207075 A1* | 7/2019 | Megrant ................. H01L 39/04 |

FOREIGN PATENT DOCUMENTS

| CN | 105043603 A | * 11/2015 |
| CN | 105470076 | 4/2016 |
| CN | 106298407 | 1/2017 |

OTHER PUBLICATIONS

Jurczak et al. "Silicon-on-Nothing (SON) an Innovative Process for Advanced CMOS," IEEE Transactions on Electron Devices, vol. 47, Issue 11, Nov. 2000, 9 pages.
Calusine et al., "Analysis and mitigation of interface losses in trenched superconducting coplanar waveguide resonators," Applied Physics Letters 112, Feb. 2018, 6 pages.
Gambetta et al., "Investigating Surface Loss Effects in Superconducting Transmon Qubits," IEEE Transactions on Applied Superconductivity, vol. 27, Issue 1, Jan. 2017, 5 pages.

* cited by examiner

*Primary Examiner* — Samuel Park
(74) *Attorney, Agent, or Firm* — Erik Johnson

(57) ABSTRACT

Devices, systems, methods, and/or computer-implemented methods that can facilitate a qubit device comprising a superconducting circuit provided on an encapsulated vacuum cavity are provided. According to an embodiment, a device can comprise a substrate having an encapsulated vacuum cavity provided on the substrate. The device can further comprise a superconducting circuit provided on the encapsulated vacuum cavity.

6 Claims, 10 Drawing Sheets

SUPERCONDUCTING CIRCUIT PROVIDED ON AN ENCAPSULATED VACUUM CAVITY

BACKGROUND

The subject disclosure relates to qubit devices and a method for forming the same. More specifically, the subject disclosure relates to a qubit device comprising a superconducting circuit provided on an encapsulated vacuum cavity and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, and/or computer program products that facilitate a qubit device comprising a superconducting circuit provided on an encapsulated vacuum cavity are described.

According to an embodiment, a device can comprise a substrate having an encapsulated vacuum cavity provided on the substrate. The device can further comprise a superconducting circuit provided on the encapsulated vacuum cavity.

According to an embodiment, a method can comprise forming an encapsulated vacuum cavity on a substrate. The method can further comprise forming a superconducting circuit on the encapsulated vacuum cavity.

According to an embodiment, a device can comprise a substrate having an encapsulated vacuum cavity provided on the substrate. The device can further comprise an epitaxial film provided on one or more internal surfaces of the encapsulated vacuum cavity.

DETAILED DESCRIPTION

Figure 1:
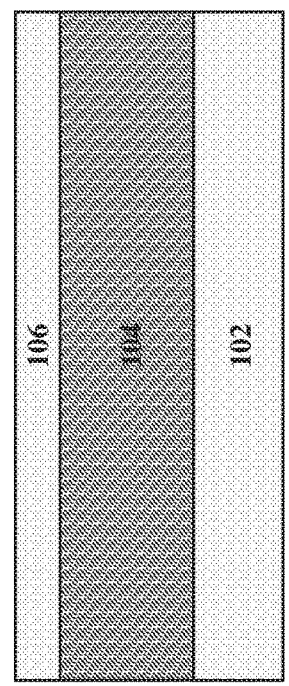
FIG. 1 illustrates a cross-sectional side view of an example, non-limiting device that can facilitate a qubit device comprising a superconducting circuit provided on an encapsulated vacuum cavity in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments of the subject disclosure are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

The fidelity of quantum computers is affected by the loss occurring in the materials used to fabricate the components that are used to build such quantum computers. For example, transmon qubit shunt capacitors, resonators, and integrated filters are typically formed by patterning superconducting regions on a silicon (Si) substrate. Loss in these components can reduce the fidelity of the overall system (e.g., a quantum computer, quantum computing chip, etc.). For the design of these components, it is desirable for the electric field to be in regions of lowest dielectric loss, or loss tangent. The relative amount of the electric field in different materials is referred to as the participation ratio. Amorphous materials have relatively high loss tangents compared to crystalline materials, and vacuum has no loss tangent.

To reduce loss of microwave components (e.g., superconducting components) used to make quantum computers, it is desirable for electric fields to be contained in regions of low loss such as, for instance, in vacuum and/or crystalline materials rather than amorphous materials. Unfortunately, upon exposure to atmosphere, most materials such as, for instance, the single-crystal silicon (Si) typically used as a substrate, form an amorphous native oxide at the surface. Therefore, from a loss perspective, it is desirable to replace dielectric regions with vacuum, without forming amorphous regions at newly formed interfaces.

FIGS. 1-5 illustrate an example, non-limiting multi-step fabrication sequence that can be implemented to fabricate one or more embodiments of the subject disclosure described herein and/or illustrated in the figures. For example, the non-limiting multi-step fabrication sequence described below and illustrated in FIGS. 1-5 can be implemented to fabricate device 500 depicted in FIG. 5. Device 500 can comprise a semiconducting and superconducting device that can comprise and/or be implemented as a quantum device in a quantum computing device. For example, device 500 can comprise an integrated semiconducting and superconducting circuit (e.g., a quantum circuit) that can comprise and/or be implemented as a qubit device in a quantum computing device such as, for instance, quantum hardware, a quantum processor, a quantum computer, and/or another quantum computing device.

As described below with reference to FIGS. 1-5, fabrication of device 500 can comprise a multi-step sequence of, for example, photolithographic and/or chemical processing steps that facilitate gradual creation of electronic-based systems, devices, components, and/or circuits in a semiconducting and superconducting device (e.g., an integrated circuit). For instance, device 500 can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., chemical vapor etch (CVE), reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), epitaxial deposition, chemical-mechanical planarization (CMP), backgrinding techniques, and/or another technique for fabricating an integrated circuit.

As referenced herein, "epitaxy" can describe a crystal growth process that can be employed to grow a new layer that is well oriented to a template (e.g., well oriented with respect to a substrate such as, for example, substrate 102 described below). Additionally, or alternatively, as referenced herein, "epitaxy" can describe a gas-phase epitaxy performed in a vacuum chamber at elevated temperature such as, for instance, low pressure chemical vapor deposition (LPCVD) or rapid thermal chemical vapor deposition (RTCVD), with precursor gases such as, for example, silane ($SiH_4$), dichlorosilane ($H_2SiCl_2$), germane ($GeH_4$), and/or another gas. As referenced herein, "chemical vapor etch (CVE)" can describe a gas phase removal of a material performed in a vacuum chamber at elevated temperature in a reactive ambient. Additionally, or alternatively, as referenced herein, "chemical vapor etch (CVE)" can describe a gas phase removal of a material performed using hydrogen chloride (HCl) as the etch gas, which removes silicon-germanium (SiGe) at a much higher rate than silicon (Si).

As described below with reference to FIGS. 1-5, device 500 can be fabricated using various materials. For example, device 500 can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

FIG. 1 illustrates a cross-sectional side view of an example, non-limiting device 100 that can facilitate a qubit device comprising a superconducting circuit provided on an encapsulated vacuum cavity in accordance with one or more embodiments described herein.

Device 100 can comprise a substrate 102. Substrate 102 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 102 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor. In some embodiments, substrate 102 can comprise a single element semiconductor substrate or a compound semiconductor substrate. In the example embodiment depicted in FIG. 1, substrate 102 can comprise a single crystal silicon (Si) substrate. Substrate 102 can comprise a thickness (e.g., height) ranging from approximately 50 micrometers (μm) to approximately 1 millimeter (mm). In some embodiments, substrate 102 can comprise a thickness (e.g., height) of 725 μm.

Device 100 can further comprise a removable layer 104 formed (e.g., grown) on substrate 102 as illustrated in FIG. 1. Removable layer 104 can comprise an epitaxial film that can be epitaxially grown on substrate 102 (e.g., via epitaxial deposition, LPCVD, RTCVD, etc.). In the example embodiment depicted in FIG. 1, removable layer 104 can comprise an epitaxial semiconductor film that can be epitaxially grown on substrate 102. For instance, removable layer 104 can comprise a compound epitaxial semiconductor film such as, for example, silicon-germanium (SiGe) that can be epitaxially grown on substrate 102. Removable layer 104 can comprise an epitaxial film comprising a certain composition of silicon-germanium (SiGe). For example, removable layer 104 can comprise an epitaxial film comprising a certain composition of silicon-germanium (SiGe) that can be determined using the equation: $Si_{(1-x)}Ge_x$, where x denotes the germanium (Ge) fraction that can be adjusted to achieve a desired composition of silicon-germanium (SiGe). Removable layer 104 can comprise a thickness (e.g., height) ranging from approximately 100 nanometers (nm) to approximately 50 μm. In some embodiments, removable layer 104 can comprise a thickness (e.g., height) of 1 μm.

Device 100 can further comprise a cap layer 106 formed (e.g., grown) on removable layer 104 as illustrated in FIG. 1. Cap layer 106 can comprise an epitaxial film that can be epitaxially grown on removable layer 104 (e.g., via epitaxial deposition, LPCVD, RTCVD, etc.). Cap layer 106 can comprise the same material as that of substrate 102 (e.g., silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, silicon/silicon-germanium (Si/SiGe), silicon/silicon carbide (Si/SiC), silicon-on-insulators (SOIs), silicon germanium-on-insulators (SGOIs), etc.). In the example embodiment depicted in FIG. 1, cap layer 106 can be formed using, for instance, silicon (Si) and/or another material. This example of material is not intended to be limiting. From this disclosure those of ordinary skill in the art will be able to conceive of many other materials suitable for forming cap layer 106 and the same are contemplated within the scope of the illustrative embodiments. In the example embodiment depicted in FIG. 1, cap layer 106 can comprise a single crystal silicon (Si) material. Cap layer 106 can comprise a thickness (e.g., height) ranging from approximately 10 nm to approximately 1 µm. In some embodiments, cap layer 106 can comprise a thickness (e.g., height) of 100 nm.

Materials for removable layer 104 described above can be selected based on the composition of substrate 102 and/or cap layer 106, to provide crystal quality above a particular quality threshold. For example, removable layer 104 can be formed using a certain composition of silicon-germanium (SiGe) to match the crystal lattice of substrate 102 and/or cap layer 106. In one embodiment, removable layer 104 can comprise a gradual change in composition from the interface with substrate 102 to the interface with cap layer 106 to avoid creating crystal defects (e.g. dislocations) in removable layer 104. In one embodiment, the gradual change in composition can be a linear change. These examples of materials are not intended to be limiting. From this disclosure those of ordinary skill in the art will be able to conceive of many other materials suitable for forming removable layer 104 and the same are contemplated within the scope of the illustrative embodiments.

Removable layer 104 and/or cap layer 106 described above can comprise epitaxial films that can be grown on substrate 102 using an epitaxial film growth process performed in an epitaxial growth furnace (e.g., via epitaxial deposition, LPCVD, RTCVD, etc.). For example, removable layer 104 and/or cap layer 106 can be grown on substrate 102 together in situ during the same fabrication phase (e.g., in situ epitaxial film growth performed in an epitaxial growth furnace via, for instance, LPCVD, RTCVD, etc.).

Utilizing such an in situ epitaxial film growth process to grow removable layer 104 and/or cap layer 106 on substrate 102 in such a manner can facilitate desirable crystallinity of each layer (film), as well as prevent oxidation and/or defects at the interface between removable layer 104 and cap layer 106 and/or at the interface between substrate 102 and removable layer 104. Utilizing such an in situ epitaxial film growth process to grow removable layer 104 and/or cap layer 106 on substrate 102 in such a manner can further facilitate repeatable fabrication of each of such layers to a desirable dimension (e.g., height, thickness, etc.). Such repeatable fabrication of each of such layers to a desirable dimension (e.g., height, thickness, etc.) can facilitate: improved consistency of the desirable dimension in a plurality of qubit devices (e.g., a plurality of devices 500) fabricated using such an in situ epitaxial film growth process; and/or improved coherence time, improved performance, and/or improved lifespan of such a qubit device fabricated using such an in situ epitaxial film growth process.

Figure 2:
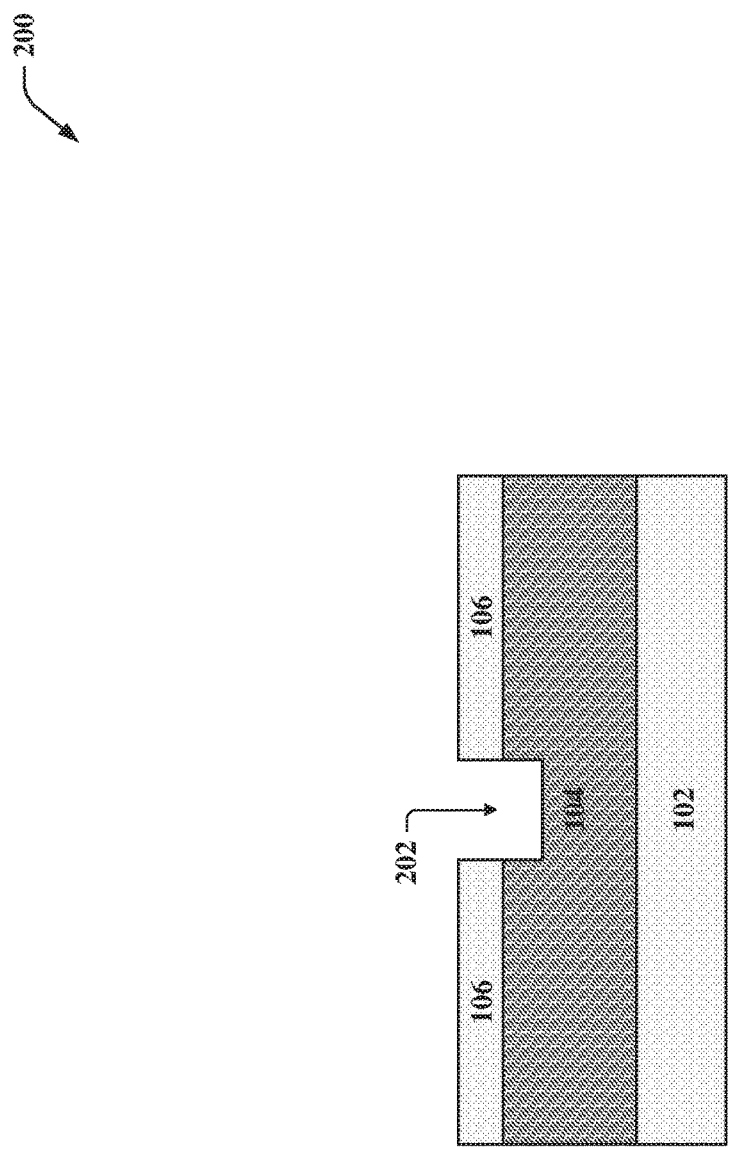
FIG. 2 illustrates a cross-sectional side view of the example, non-limiting device of FIG. 1 after removing portions of one or more material layers from the device of FIG. 1 in accordance with one or more embodiments described herein.

FIG. 2 illustrates a cross-sectional side view of an example, non-limiting device 200 that can facilitate a qubit device comprising a superconducting circuit provided on an encapsulated vacuum cavity in accordance with one or more embodiments described herein. Additionally, or alternatively, FIG. 2 illustrates a cross-sectional side view of the example, non-limiting device 100 of FIG. 1 after removing portions of one or more material layers from device 100 in accordance with one or more embodiments described herein. Repetitive description of like elements and/or processes employed in other embodiments described herein is omitted for sake of brevity.

Device 200 can comprise an example, non-limiting alternative embodiment of device 100 after removing portions of cap layer 106 and/or removable layer 104 to form a port 202 that can enable access to removable layer 104. For example, port 202 can enable removal of a portion of removable layer 104 as described below with reference to FIG. 3.

Port 202 can be formed in cap layer 106 as illustrated in the example embodiment depicted in FIG. 2. In this example embodiment, port 202 can be formed in cap layer 106 using one or more photolithography, patterning, photoresist, and/or etching techniques defined above (e.g., a lithographic patterning process, CVE, RIE, dry etching, wet etching, ion beam etching, plasma etching, laser ablation, etc.). For example, although not illustrated in FIG. 2, a photoresist material (e.g., a positive-tone photoresist, a negative-tone photoresist, a hybrid-tone photoresist, etc.) can be formed and/or patterned on cap layer 106 to define the shape and/or dimensions of port 202 on cap layer 106. In this example, based on forming and/or patterning the photoresist material on cap layer 106 to define the shape and/or dimensions of port 202, an etching process (e.g., CVP, RIE, dry etching, wet etching, ion beam etching, plasma etching, laser ablation, etc.) can be performed to remove portions of cap layer 106 and removable layer 104, thereby yielding port 202 illustrated in FIG. 2. In this example, based on removing portions of cap layer 106 to form port 202, the photoresist material can be removed using a lift off technique (e.g., washing with a solvent, stripping, etc.).

Figure 3:
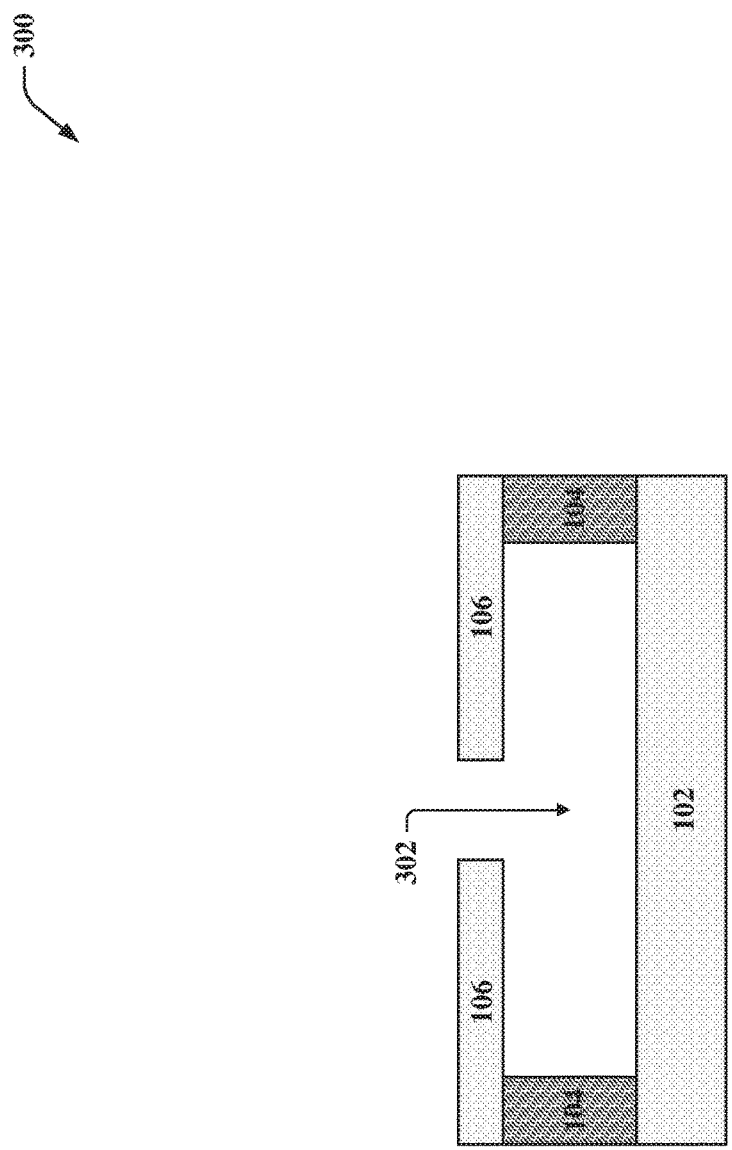
FIG. 3 illustrates a cross-sectional side view of the example, non-limiting device of FIG. 2 after removing a portion of a removable layer from the device of FIG. 2 to form a cavity in accordance with one or more embodiments described herein.

FIG. 3 illustrates a cross-sectional side view of an example, non-limiting device 300 that can facilitate a qubit device comprising a superconducting circuit provided on an encapsulated vacuum cavity in accordance with one or more embodiments described herein. Additionally, or alternatively, FIG. 3 illustrates a cross-sectional side view of the example, non-limiting device 200 of FIG. 2 after removing a portion of a removable layer from device 200 to form a cavity in accordance with one or more embodiments described herein. Repetitive description of like elements and/or processes employed in other embodiments described herein is omitted for sake of brevity.

Device 300 can comprise an example, non-limiting alternative embodiment of device 200 after removing a portion of removable layer 104 to form a cavity 302 as illustrated in the example embodiment depicted in FIG. 3. In this example embodiment, such a portion of removable layer 104 can be removed using one or more etching techniques defined herein (e.g., CVP, RIE, dry etching, wet etching, ion beam etching, plasma etching, laser ablation, etc.) to form cavity 302 illustrated in FIG. 3.

Figure 4:
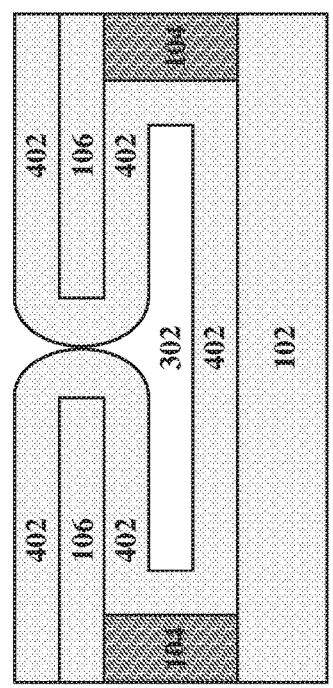
FIG. 4 illustrates a cross-sectional side view of the example, non-limiting device of FIG. 3 after forming an epitaxial film on one or more internal surfaces of the cavity of the device of FIG. 3 in accordance with one or more embodiments described herein.

FIG. 4 illustrates a cross-sectional side view of an example, non-limiting device 400 that can facilitate a qubit device comprising a superconducting circuit provided on an encapsulated vacuum cavity in accordance with one or more embodiments described herein. Additionally, or alternatively, FIG. 4 illustrates a cross-sectional side view of the example, non-limiting device 300 of FIG. 3 after forming an epitaxial film on one or more internal surfaces of the cavity of device 300 in accordance with one or more embodiments described herein. Repetitive description of like elements and/or processes employed in other embodiments described herein is omitted for sake of brevity.

Device 400 can comprise an example, non-limiting alternative embodiment of device 300 after forming (e.g., growing) an epitaxial film 402 on one or more internal surfaces of cavity 302 as illustrated in the example embodiment depicted in FIG. 4. For example, device 400 can comprise an example, non-limiting alternative embodiment of device 300 after forming (e.g., growing) an epitaxial film 402 inside cavity 302 on: a surface (e.g., top surface) of substrate 102; surfaces (e.g., side surfaces) of removable layer 104; and/or a surface (e.g., bottom surface) of cap layer 106 as illustrated in the example embodiment depicted in FIG. 4.

Epitaxial film 402 can comprise an epitaxial film that can be epitaxially grown (e.g., via epitaxial deposition, LPCVD, RTCVD, etc.) on one or more internal surfaces of cavity 302 as described above and illustrated in the example embodiment depicted in FIG. 4. Epitaxial film 402 can comprise the same material as that of substrate 102 and/or cap layer 106 (e.g., silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, silicon/silicon-germanium (Si/SiGe), silicon/silicon carbide (Si/SiC), silicon-on-insulators (SOIs), silicon germanium-on-insulators (SGOIs), etc.). In the example embodiment depicted in FIG. 4, epitaxial film 402 can be formed using, for instance, silicon (Si) and/or another material. This example of material is not intended to be limiting. From this disclosure those of ordinary skill in the art will be able to conceive of many other materials suitable for forming epitaxial film 402 and the same are contemplated within the scope of the illustrative embodiments. In the example embodiment depicted in FIG. 4, epitaxial film 402 can comprise a crystalline material film or an amorphous free material film. For instance, in this example embodiment, epitaxial film 402 can comprise a single crystal silicon (Si) material. In this example embodiment, epitaxial film 402 can comprise an epitaxial silicon (Si) film. Epitaxial film 402 can comprise a thickness (e.g., height) ranging from approximately 10 nm to approximately 1 μm. In some embodiments, epitaxial film 402 can comprise a thickness (e.g., height) of 50 nm.

Epitaxial film 402 can be grown on one or more internal surfaces of cavity 302 as described above using an epitaxial film growth process performed in an epitaxial growth furnace (e.g., via epitaxial deposition, LPCVD, RTCVD, etc.). For example, epitaxial film 402 can be grown on one or more internal surfaces of cavity 302 in situ in the same vacuum chamber used to remove a portion of removable layer 104 as described above with reference to FIG. 3 (e.g., in situ etching of removable layer 104 and epitaxial film growth of epitaxial film 402 performed in an epitaxial growth furnace via, for instance, LPCVD, RTCVD, etc.).

Utilizing such an in situ epitaxial film growth process to grow epitaxial film 402 on one or more internal surfaces of cavity 302 in such a manner can facilitate desirable crystallinity of epitaxial film 402, as well as prevent oxidation and/or defects at the interface between: epitaxial film 402 and substrate 102; epitaxial film 402 and removable layer 104; and/or epitaxial film 402 and cap layer 106. Utilizing such an in situ epitaxial film growth process to grow epitaxial film 402 on one or more internal surfaces of cavity 302 in such a manner can further facilitate repeatable fabrication of epitaxial film 402 to a desirable dimension (e.g., height, thickness, etc.). Such repeatable fabrication of epitaxial film 402 to a desirable dimension (e.g., height, thickness, etc.) can facilitate: improved consistency of the desirable dimension in a plurality of qubit devices (e.g., a plurality of devices 500) fabricated using such an in situ epitaxial film growth process; and/or improved coherence time, improved performance, and/or improved lifespan of such a qubit device fabricated using such an in situ epitaxial film growth process.

As illustrated in the example embodiment depicted in FIG. 4, epitaxial film 402 can be epitaxially grown on one or more internal surfaces of cavity 302, as well as one or more surfaces of cap layer 106. For example, as illustrated in the example embodiment depicted in FIG. 4, epitaxial film 402 can be epitaxially grown on one or more internal surfaces of cavity 302, as well as a top surface of cap layer 106 and one or more side surfaces of cap layer 106 (e.g., the side surfaces of cap layer 106 that can constitute the walls of port 202). For instance, epitaxial film 402 can be epitaxially grown on one or more internal surfaces of cavity 302, a top surface of cap layer 106, and side surfaces of cap layer 106 that can constitute walls of port 202 (such walls of port 202 are not annotated in the figures). As described below and illustrated in the example embodiment depicted in FIG. 5, epitaxial film 402 can be epitaxially grown on such surfaces described above until epitaxial film 402 encloses and hermetically seals cavity 302 at port 202.

Figure 5:
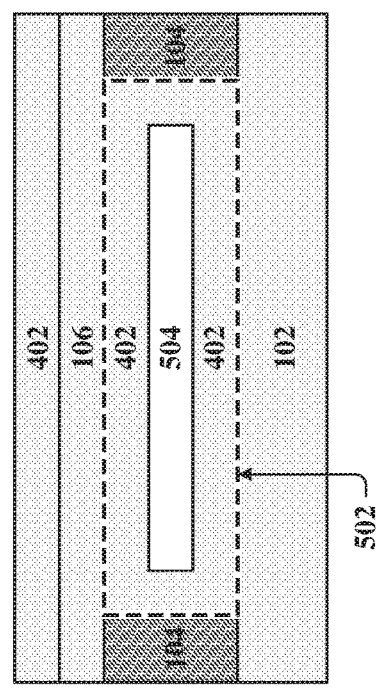
FIG. 5 illustrates a cross-sectional side view of the example, non-limiting device of FIG. 4 after hermetically sealing the cavity to form an encapsulated vacuum cavity in accordance with one or more embodiments described herein.

FIG. 5 illustrates a cross-sectional side view of an example, non-limiting device 500 that can facilitate a qubit device comprising a superconducting circuit provided on an encapsulated vacuum cavity in accordance with one or more embodiments described herein. Additionally, or alternatively, FIG. 5 illustrates a cross-sectional side view of the example, non-limiting device 400 of FIG. 4 after hermetically sealing the cavity to form an encapsulated vacuum cavity in accordance with one or more embodiments described herein. Repetitive description of like elements and/or processes employed in other embodiments described herein is omitted for sake of brevity.

FIG. 5 illustrates a cross-sectional side view of device 500 as viewed at a certain distance from port 202 (e.g., as viewed at a distance of, for instance, 1 centimeter (cm) from port 202, where such a distance is defined along an axis extending into and out of the page of FIG. 5). Device 500 can comprise an example, non-limiting alternative embodiment of device 400 after epitaxially growing epitaxial film 402 on device 400 such that it encloses and hermetically seals cavity 302 at port 202 to form an encapsulated vacuum cavity 502 having vacuum 504 inside, where encapsulated vacuum cavity 502 is represented by a rectangle having a dashed line in FIG. 5.

As described above with reference to the example embodiment depicted in FIG. 4, epitaxial film 402 can be epitaxially grown on one or more internal surfaces of cavity 302 (e.g., surfaces of substrate 102, removable layer 104, and/or cap layer 106 located inside cavity 302), a top surface of cap layer 106, and side surfaces of cap layer 106 that can constitute walls of port 202 until epitaxial film 402 encloses and hermetically seals cavity 302 at port 202 to form encapsulated vacuum cavity 502 having vacuum 504 inside. In the example embodiment depicted in FIG. 5, based on epitaxially growing epitaxial film 402 until it encloses and hermetically seals cavity 302 at port 202 to form encapsulated vacuum cavity 502 as described above, encapsulated vacuum cavity 502 can thereby comprise vacuum 504 and epitaxial film 402 that has been formed on the internal surfaces of encapsulated vacuum cavity 502 as described above.

In the example embodiment depicted in FIG. 5, based on epitaxially growing epitaxial film 402 until it encloses and hermetically seals cavity 302 at port 202 to form encapsulated vacuum cavity 502 as described above, the portion of epitaxial film 402 grown on the external (e.g., top) surface of cap layer 106, cap layer 106 itself, and/or the portion of epitaxial film 402 grown on the internal (e.g., bottom) surface of cap layer 106 can maintain a planar shape or approximately planar shape. For example, after forming encapsulated vacuum cavity 502 as described above, such portions of epitaxial film 402 and/or cap layer 106 can maintain a horizontal planar shape or approximately horizontal planar shape (e.g., a horizontal planar shape that extends horizontally across the page of FIG. 5 (e.g., from right to left or vice versa)). In this example, it should be appreciated that such portions of epitaxial film 402 and/or cap layer 106 can maintain such a planar shape or approximately planar shape after formation of encapsulated vacuum cavity 502 as opposed to taking on a sunken shape (e.g., settled, partially collapsed, recessed, etc.) that can dip down into device 500.

It should be appreciated that encapsulated vacuum cavity 502 comprising vacuum 504 and epitaxial film 402 that has been formed on the internal surfaces of encapsulated vacuum cavity 502 as described above can provide one or more regions of relatively low dielectric loss and/or relatively low dielectric constant (e.g., relatively low when compared to dielectric loss and/or dielectric constant of amorphous materials used to fabricate current state of the art qubit devices). It should be further appreciated that such in-situ hermetic sealing of encapsulated vacuum cavity 502 with epitaxial film 402 as described above can prevent or mitigate native oxide formation on the surfaces of one or more materials formed inside of encapsulated vacuum cavity 502 (e.g., surfaces of epitaxial film 402).

Although not illustrated in FIG. 5, in some embodiments, device 500 can further comprise a superconducting circuit formed on and/or adjacent to encapsulated vacuum cavity 502. For example, device 500 can further comprise a superconducting circuit such as, for instance, a qubit (e.g., a transmon qubit) that can be formed on and/or embedded into one or more material layers of device 500 (e.g., cap layer 106, epitaxial film 402, etc.) such that the superconducting circuit is positioned on and/or adjacent to encapsulated vacuum cavity 502 as described below.

In the above example, such a qubit (e.g., a transmon qubit) can be formed on and/or embedded into such one or more material layers of device 500 using one or more photolithography, patterning, photoresist, and/or etching techniques defined above (e.g., a lithographic patterning process, CVE, CMP, RIE, dry etching, wet etching, ion beam etching, plasma etching, laser ablation, etc.). For example, although not illustrated in FIG. 5, one or more photoresist materials (e.g., a positive-tone photoresist, a negative-tone photoresist, a hybrid-tone photoresist, etc.) can be used to pattern (e.g., iteratively) the shape and/or dimensions of one or more superconducting components (e.g., transmon qubit shunt capacitors, resonators, integrated filters, etc.) that can be formed on and/or embedded into such one or more material layers of device 500 (e.g., cap layer 106, epitaxial film 402, etc.). In this example, based on patterning the shape and/or dimensions of such one or more superconducting components, an etching and/or polishing process (e.g., CVP, RIE, dry etching, wet etching, ion beam etching, plasma etching, laser ablation, CMP, backgrinding, etc.) can be performed to remove, for instance, one or more portions of epitaxial film 402 grown on the external surface (e.g., top surface) of cap layer 106 and/or one or more portions of cap layer 106 to form one or more pores (e.g., trenches, voids, openings, holes, etc.) in such material layer(s) of device 500. In this example, based on removing such one or more portions of epitaxial film 402 and/or cap layer 106, one or more superconducting materials (e.g., aluminum (Al), niobium (Nb), etc.) can be deposited into such one or more pores to form one or more superconducting components (e.g., transmon qubit shunt capacitors, resonators, integrated filters, etc.) that can thereby be positioned on and/or adjacent to encapsulated vacuum cavity 502. In this example, based on such deposition of the one or more superconducting materials into such one or more pores to form such one or more superconducting components on and/or adjacent to encapsulated vacuum cavity 502 as described above, the one or more superconducting components can be polished (e.g., via CMP, etc.). In this example, the one or more photoresist materials remaining on device 500 can be removed using a lift off technique (e.g., washing with a solvent, stripping, etc.) to yield a device comprising substrate 102 having encapsulated vacuum cavity 502 provided on substrate 102 and a superconducting circuit (e.g., a qubit, a transmon qubit, etc.) provided on and/or adjacent to encapsulated vacuum cavity 502.

In the above described example embodiment, it should be appreciated that, during operation of such a device, encapsulated vacuum cavity 502 can further comprise a portion of an electric field that can be created by such a superconducting circuit. For example, during operation of such a device described above, the superconducting circuit (e.g., a qubit) that can be formed on and/or adjacent to encapsulated vacuum cavity 502 can generate an electric field. In this example, a portion of such an electric field can enter encapsulated vacuum cavity 502, where, as described above one or more regions of relatively low dielectric loss and/or relatively low dielectric constant can exist. In this example and where the superconducting circuit comprises a qubit, by providing such one or more regions of relatively low dielectric loss and/or relatively low dielectric constant, device 500 and/or encapsulated vacuum cavity 502 can thereby facilitate reduced energy loss by the qubit, improved performance of device 500, and/or improved fidelity of device 500.

Although not illustrated in the figures, it should be appreciated that one or more variations to the example, non-limiting fabrication sequence described above and illustrated in FIGS. 1-5 can be implemented to develop one or more example, non-limiting alternative embodiments of devices 100, 200, 300, 400, and/or 500. In one example variation to the example, non-limiting fabrication sequence described above and illustrated in FIGS. 1-5, prior to forming port 202 as described above with reference to FIG. 2, a sacrificial hardmask can be formed on cap layer 106 of device 100 by depositing a hardmask material (e.g., silicon dioxide ($SiO_2$) or another dielectric material) on cap layer 106 using one or more photolithography, patterning, photoresist, and/or etching techniques defined above (e.g., a lithographic patterning process, CVE, CMP, RIE, dry etching, wet etching, ion beam etching, plasma etching, laser ablation, etc.). In this example variation, based on forming such a hardmask on cap layer 106, port 202 can be formed using a photolithography, patterning, photoresist, and/or etching process as described above with reference to FIG. 2, where such an etching process involves etching through the hardmask, through cap layer 106, and partially into a portion of removable layer 104. In this example variation, cavity 302 can then be formed using a photolithography, patterning, photoresist, and/or etching process as described above with reference to FIG. 3 to remove a portion of removable layer 104 via port 202. In this example variation, a selective silicon (Si) epitaxy process can then be implemented to grow epitaxial film 402 on one or more internal surfaces of cavity 302 and on the side surfaces of cap layer 106 that can constitute the walls of port 202, but not on the hardmask or the external surface (e.g., top surface) of cap layer 106. In this example variation, the hardmask can then be removed (e.g., ex-situ, outside the epitaxy vacuum chamber) from cap layer 106 using a lift off technique (e.g., washing with a solvent, stripping, etc.) to yield a device that can comprise an example, non-limiting alternative embodiment of device 500, where such a device does not have the one or more portions of epitaxial film 402 depicted in FIG. 5 that can be grown on the external surface (e.g., top surface) of cap layer 106.

In another example variation to the example, non-limiting fabrication sequence described above and illustrated in FIGS. 1-5, removable layer 104 can be patterned earlier in such a fabrication sequence to yield a final device with a terminated etch and no remaining removable layer 104. For instance, in this example variation, rather than forming port 202 in device 100 as described above with reference to FIG. 2, a channel having a defined shape (e.g., a channel shaped as a square, rectangle, circle, etc.) can be formed in device 100 using one or more photolithography, patterning, photoresist, and/or etching techniques defined above (e.g., a lithographic patterning process, CVE, CMP, RIE, dry etching, wet etching, ion beam etching, plasma etching, laser ablation, etc.). In this example variation, such a channel (e.g., a channel formed in the shape of a square as seen from a top view of device 100) can be formed in device 100 by patterning the shape and dimensions of the channel on cap layer 106 using a photoresist material and subsequently etching through cap layer 106, through removable layer 104, and partially into substrate 102. In this example variation, based on forming such a channel in device 100, a silicon (Si) epitaxy process can be performed to form a layer of silicon (Si) inside the channel and on exposed surfaces of: substrate 102 (e.g., an exposed top surface of substrate 102); removable layer 104 (e.g., exposed side surfaces (e.g., vertical surfaces) of removable layer 104); and/or cap layer 106 (e.g., exposed side surfaces (e.g., vertical surfaces) of cap layer 106). In this example, variation, port 202 can then be formed in the region surrounded by the channel (e.g., at the center of the region surrounded by the channel) using a photolithography, patterning, photoresist, and/or etching process as described above with reference to FIG. 2, where such an etching process involves etching through cap layer 106 and partially into a portion of removable layer 104. In this example variation, cavity 302 can then be formed using a photolithography, patterning, photoresist, and/or etching process as described above with reference to FIG. 3 to remove all of removable layer 104 from the region surrounded by the channel via port 202. In this example variation, another silicon (Si) epitaxy process can then be implemented to grow epitaxial film 402 on the external surface (e.g., top surface) of cap layer 106, on the side surfaces of cap layer 106 that can constitute the walls of port 202, and on the internal surfaces of cavity 302. In this example variation, epitaxial film 402 can be epitaxially grown on such surfaces of cap layer 106 and cavity 302 until it hermetically seals port 202 and cavity 302, thereby forming encapsulated vacuum cavity 502 having vacuum 504 inside and yielding a device that can comprise an example, non-limiting alternative embodiment of device 500, where such a device does not have removable layer 104.

Device 500 can be associated with various technologies. For example, device 500 can be associated with semiconductor and/or superconductor device technologies, semiconductor and/or superconductor device fabrication technologies, quantum computing device technologies, quantum computing device fabrication technologies, qubit device technologies, qubit device fabrication technologies, and/or other technologies.

Device 500 can provide technical improvements to the various technologies listed above. For example, device 500 can comprise a qubit device that can be implemented in a quantum computing device (e.g., a quantum processor, quantum computer, etc.) to facilitate improved quantum computing. For instance, as described above, encapsulated vacuum cavity 502 can be hermetically sealed with vacuum 504 inside and a superconducting circuit that can comprise, for example, a qubit (e.g., a transmon qubit) can be formed on and/or adjacent to encapsulated vacuum cavity 502. In this example, a portion of an electric filed that can be generated by such a qubit during operation can enter encapsulated vacuum cavity 502, where, as described above one or more regions of relatively low dielectric loss and/or relatively low dielectric constant can exist. In this example, by providing such one or more regions of relatively low dielectric loss and/or relatively low dielectric constant, device 500 and/or encapsulated vacuum cavity 502 can thereby facilitate reduced energy loss by the qubit, improved performance of device 500 (e.g., reduced error rates associated with device 500, improved accuracy of device 500, etc.), and/or improved fidelity of device 500.

Device 500 can provide technical improvements to a processing unit associated with and/or comprising device 500. For example, as described above, encapsulated vacuum cavity 502 of device 500 can facilitate reduced energy loss by such a qubit that can be formed on and/or adjacent to encapsulated vacuum cavity 502, improved performance of device 500 (e.g., reduced error rates associated with device 500, improved accuracy of device 500, etc.), and/or improved fidelity of device 500. In this example, device 500 and/or encapsulated vacuum cavity 502 can thereby enable improved performance, accuracy, and/or fidelity of a quantum computing device comprising device 500. In this example, such a quantum computing device can comprise a processing unit such as, for example, a quantum processor comprising one or more of device 500. Such improvement(s) to such a processing unit can further facilitate improved efficiency of the processing unit, as well as reduced computational costs of the processing unit.

A practical application of device 500 is that it can be implemented in a quantum computing device (e.g., a quantum processor, a quantum computer, etc.) to improve processing fidelity, processing performance, and/or processing costs of such a device, which can facilitate fast and/or possibly universal quantum computing. Such a practical application can improve the output (e.g., computation and/or processing results) of one or more compilation jobs (e.g., quantum computing jobs) that are executed on such a device. In an example, a practical application of device 500 is that it can be implemented in a quantum computing device (e.g., a quantum processor, a quantum computer, etc.) that can be used to compute one or more solutions (e.g., heuristic(s), etc.) to a variety of problems ranging in complexity (e.g., an estimation problem, an optimization problem, etc.) in a variety of domains (e.g., finance, chemistry, medicine, etc.). For instance, a practical application of device 500 is that it can be implemented in such a quantum computing device that can be used to compute one or more solutions (e.g., heuristic(s), etc.) to an optimization problem in the domain of chemistry, medicine, and/or finance, where such a solution can be used to engineer, for instance, a new chemical compound, a new medication, and/or a new option premium model.

It should be appreciated that device 500 provides a new approach for facilitating a qubit device comprising a superconducting circuit provided on an encapsulated vacuum cavity and/or a new approach for fabricating such a qubit device which is driven by relatively new quantum computing technologies. For example, device 500 provides a new approach for providing a superconducting circuit (e.g., a qubit, a transmon qubit, etc.) on and/or adjacent to an encapsulated cavity (e.g., encapsulated vacuum cavity 502) comprising: an epitaxial film (e.g., epitaxial film 402) formed on the internal surfaces of such an encapsulated cavity; vacuum (e.g., vacuum 504) having no loss tangent; and/or a portion of an electric field that can be generated by such a superconducting circuit during operation.

Device 500 can be coupled to hardware and/or software to solve problems that are highly technical in nature, that are not abstract and that cannot be performed as a set of mental acts by a human. For example, device 500 can be implemented in a quantum computing device that can process information and/or execute calculations that are not abstract and that cannot be performed as a set of mental acts by a human.

It should be appreciated that device 500 can utilize various combinations of electrical components, mechanical components, and circuitry that cannot be replicated in the mind of a human or performed by a human. For example, facilitating quantum computing is an operation that is greater than the capability of a human mind. For instance, the amount of data processed, the speed of processing such data, and/or the types of data processed over a certain period of time by such a quantum computing device comprising and/or utilizing device 500 can be greater, faster, and/or different than the amount, speed, and/or data type that can be processed by a human mind over the same period of time.

Device 500 can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that device 500 can include information that is impossible to obtain manually by an entity, such as a human user. For example, the type, amount, and/or variety of information included in and/or processed by device 500 can be more complex than information obtained manually by a human user.

Figure 6:
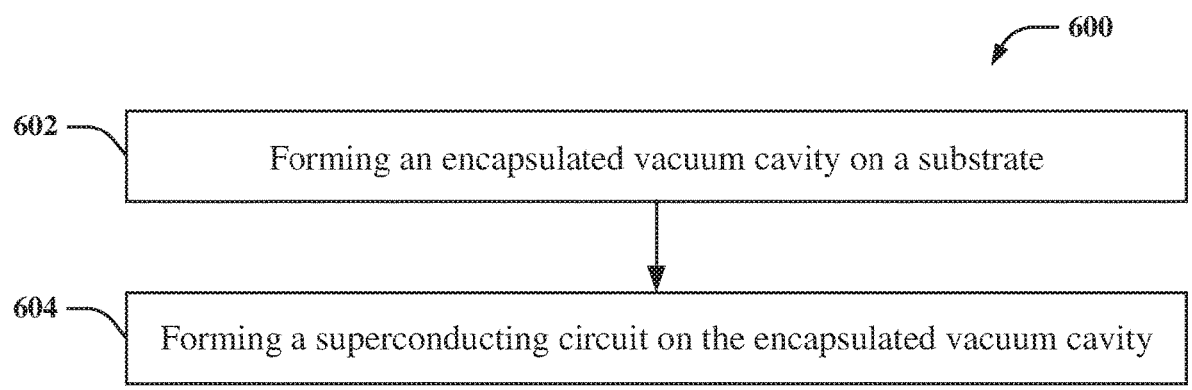
FIGS. 6, 7, 8, and 9 illustrate flow diagrams of example, non-limiting methods that can facilitate a qubit device comprising a superconducting circuit provided on an encapsulated vacuum cavity in accordance with one or more embodiments described herein.

FIG. 6 illustrates a flow diagram of an example, non-limiting method 600 that can facilitate a qubit device comprising a superconducting circuit provided on an encapsulated vacuum cavity in accordance with one or more embodiments described herein. Repetitive description of like elements and/or processes employed in other embodiments described herein is omitted for sake of brevity.

At 602, method 600 can comprise forming (e.g., via computer 1012) an encapsulated vacuum cavity (e.g., encapsulated vacuum cavity 502) on a substrate (e.g., substrate 102).

At 604, method 600 can comprise forming (e.g., via computer 1012) a superconducting circuit (e.g., a qubit, a transmon qubit, etc.) on the encapsulated vacuum cavity.

Figure 7:
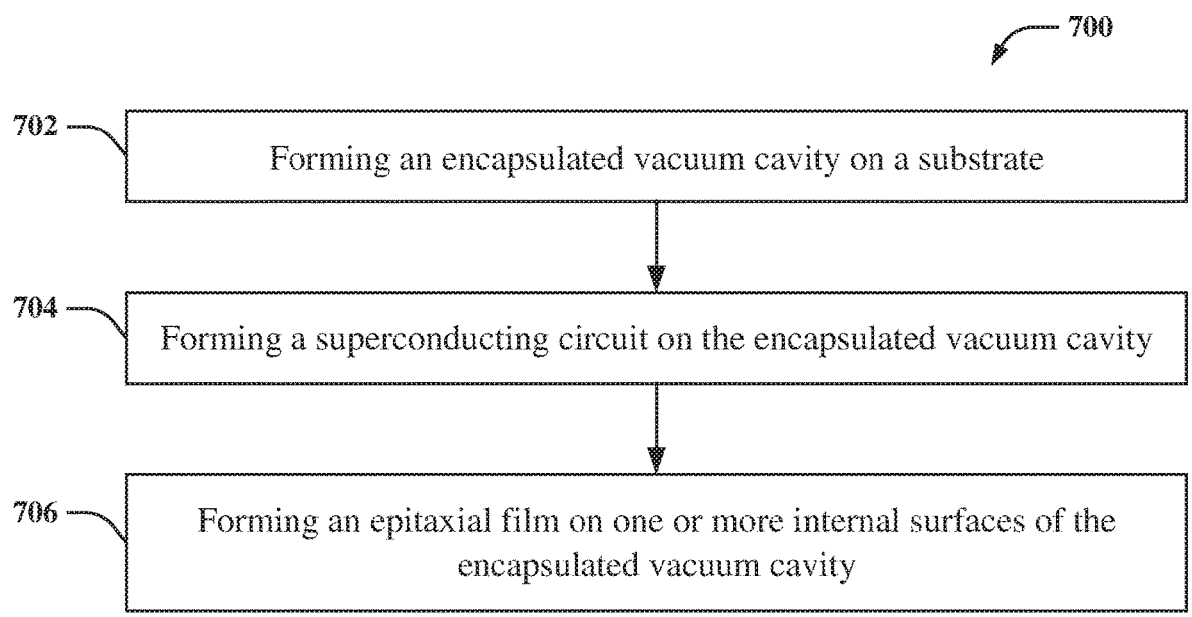

FIG. 7 illustrates a flow diagram of an example, non-limiting method 700 that can facilitate a qubit device comprising a superconducting circuit provided on an encapsulated vacuum cavity in accordance with one or more embodiments described herein. Repetitive description of like elements and/or processes employed in other embodiments described herein is omitted for sake of brevity.

At 702, method 700 can comprise forming (e.g., via computer 1012) an encapsulated vacuum cavity (e.g., encapsulated vacuum cavity 502) on a substrate (e.g., substrate 102).

At 704, method 700 can comprise forming (e.g., via computer 1012) a superconducting circuit (e.g., a qubit, a transmon qubit, etc.) on the encapsulated vacuum cavity.

At 706, method 700 can comprise forming (e.g., via computer 1012) an epitaxial film (e.g., epitaxial film 402) on one or more internal surfaces of the encapsulated vacuum cavity (e.g., on exposed surfaces of substrate 102, removable layer 104, and cap layer 106 inside port 202 and cavity 302).

Figure 8:
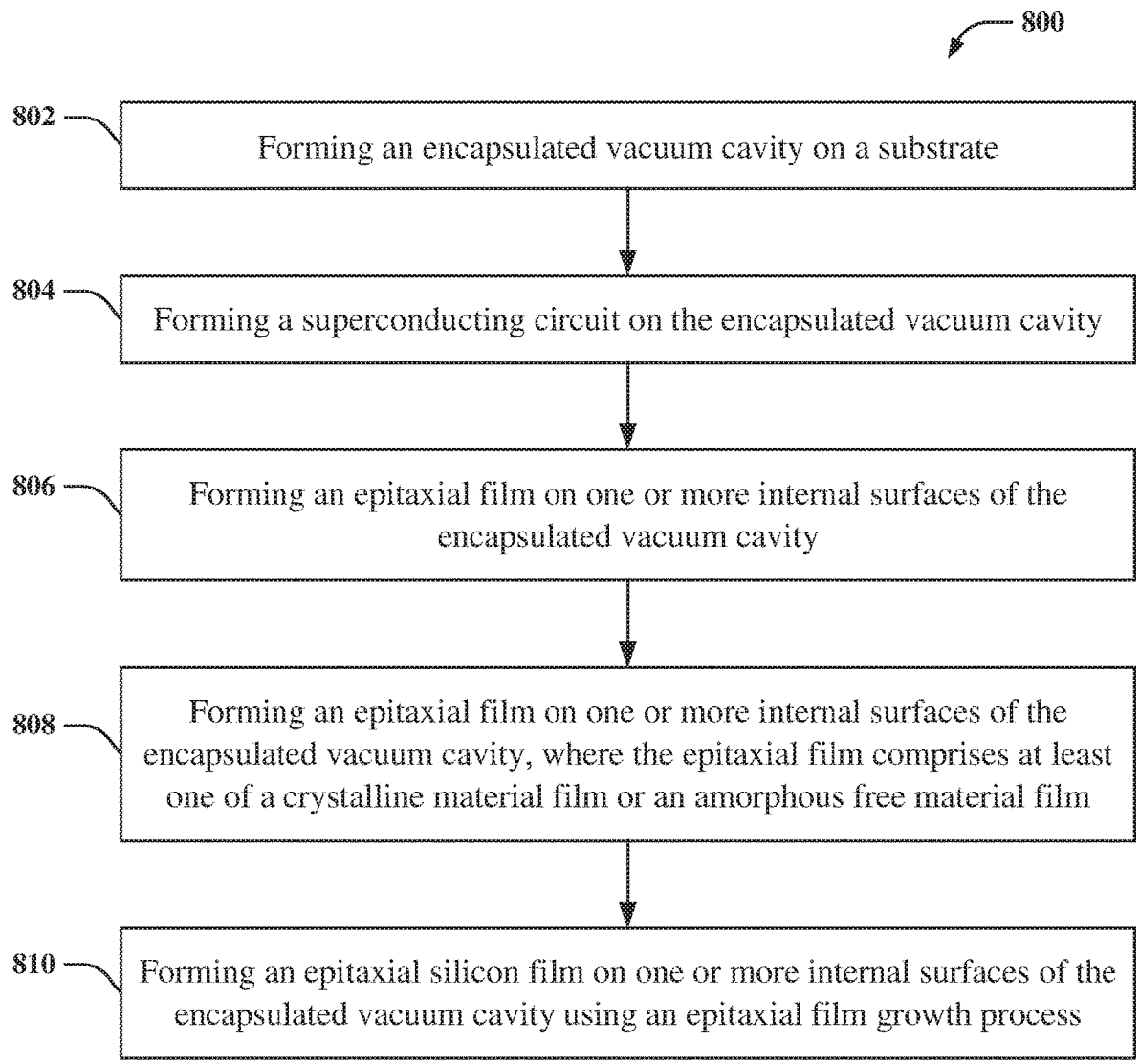

FIG. 8 illustrates a flow diagram of an example, non-limiting method 800 that can facilitate a qubit device comprising a superconducting circuit provided on an encapsulated vacuum cavity in accordance with one or more embodiments described herein. Repetitive description of like elements and/or processes employed in other embodiments described herein is omitted for sake of brevity.

At 802, method 800 can comprise forming (e.g., via computer 1012) an encapsulated vacuum cavity (e.g., encapsulated vacuum cavity 502) on a substrate (e.g., substrate 102).

At 804, method 800 can comprise forming (e.g., via computer 1012) a superconducting circuit (e.g., a qubit, a transmon qubit, etc.) on the encapsulated vacuum cavity.

At 806, method 800 can comprise forming (e.g., via computer 1012) an epitaxial film (e.g., epitaxial film 402) on one or more internal surfaces of the encapsulated vacuum cavity (e.g., on exposed surfaces of substrate 102, removable layer 104, and cap layer 106 inside port 202 and cavity 302).

At 808, method 800 can comprise forming (e.g., via computer 1012) an epitaxial film (e.g., epitaxial film 402) on one or more internal surfaces of the encapsulated vacuum cavity (e.g., on exposed surfaces of substrate 102, removable layer 104, and cap layer 106 inside port 202 and cavity 302), wherein the epitaxial film comprises at least one of a crystalline material film or an amorphous free material film (e.g., a single crystal silicon (Si) material film).

At 810, method 800 can comprise forming (e.g., via computer 1012) an epitaxial silicon film (e.g., epitaxial film 402 comprising a single crystal silicon (Si) material film) on one or more internal surfaces of the encapsulated vacuum cavity (e.g., on exposed surfaces of substrate 102, removable layer 104, and cap layer 106 inside port 202 and cavity 302) using an epitaxial film growth process (e.g., a selective silicon (Si) epitaxy, a silicon (Si) epitaxy, LPCVD, RTCVD, etc.).

Figure 9:
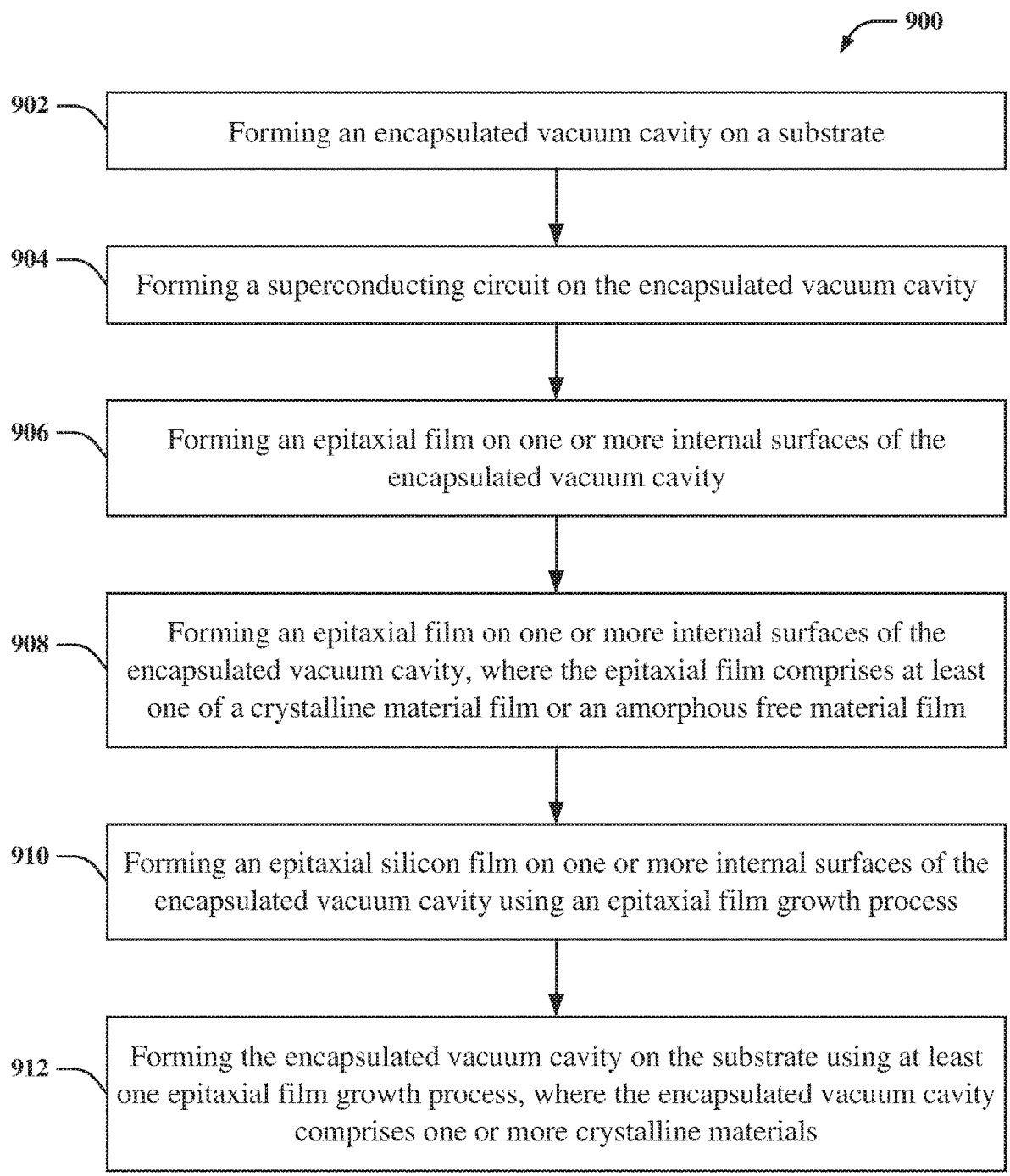

FIG. 9 illustrates a flow diagram of an example, non-limiting method 900 that can facilitate a qubit device comprising a superconducting circuit provided on an encapsulated vacuum cavity in accordance with one or more embodiments described herein. Repetitive description of like elements and/or processes employed in other embodiments described herein is omitted for sake of brevity.

At 902, method 900 can comprise forming (e.g., via computer 1012) an encapsulated vacuum cavity (e.g., encapsulated vacuum cavity 502) on a substrate (e.g., substrate 102).

At 904, method 900 can comprise forming (e.g., via computer 1012) a superconducting circuit (e.g., a qubit, a transmon qubit, etc.) on the encapsulated vacuum cavity.

At 906, method 900 can comprise forming (e.g., via computer 1012) an epitaxial film (e.g., epitaxial film 402) on one or more internal surfaces of the encapsulated vacuum cavity (e.g., on exposed surfaces of substrate 102, removable layer 104, and cap layer 106 inside port 202 and cavity 302).

At 908, method 900 can comprise forming (e.g., via computer 1012) an epitaxial film (e.g., epitaxial film 402) on one or more internal surfaces of the encapsulated vacuum cavity (e.g., on exposed surfaces of substrate 102, removable layer 104, and cap layer 106 inside port 202 and cavity 302), wherein the epitaxial film comprises at least one of a crystalline material film or an amorphous free material film (e.g., a single crystal silicon (Si) material film).

At 910, method 900 can comprise forming (e.g., via computer 1012) an epitaxial silicon film (e.g., epitaxial film 402 comprising a single crystal silicon (Si) material film) on one or more internal surfaces of the encapsulated vacuum cavity (e.g., on exposed surfaces of substrate 102, removable layer 104, and cap layer 106 inside port 202 and cavity 302) using an epitaxial film growth process (e.g., a selective silicon (Si) epitaxy, a silicon (Si) epitaxy, LPCVD, RTCVD, etc.).

At 912, method 900 can comprise forming (e.g., via computer 1012) the encapsulated vacuum cavity on the substrate using at least one epitaxial film growth process (e.g., a selective silicon (Si) epitaxy, a silicon (Si) epitaxy, LPCVD, RTCVD, etc.), wherein the encapsulated vacuum cavity comprises one or more crystalline materials (e.g., substrate 102, epitaxial film 402, etc.).

The example, non-limiting multi-step fabrication sequences described above with reference to FIGS. 1-5 and/or the operations of methods 600, 700, 800, 900 described above, which can be implemented to fabricate one or more embodiments of the subject disclosure described herein and/or illustrated in the figures, can be implemented by a computing system (e.g., operating environment 1000 illustrated in FIG. 10 and described below) and/or a computing device (e.g., computer 1012 illustrated in FIG. 10 and described below). In non-limiting example embodiments, such computing system (e.g., operating environment 1000) and/or such computing device (e.g., computer 1012) can comprise one or more processors and one or more memory devices that can store executable instructions thereon that, when executed by the one or more processors, can facilitate performance of the example, non-limiting multi-step fabrication operations described herein with reference to FIGS. 1-5 and/or the operations of methods 600, 700, 800, 900 described above with reference to FIGS. 6-9, respectively. As a non-limiting example, the one or more processors can facilitate performance of the example, non-limiting multi-step fabrication operations described herein with reference to FIGS. 1-5 and/or the operations of methods 600, 700, 800, 900 described above by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 10:
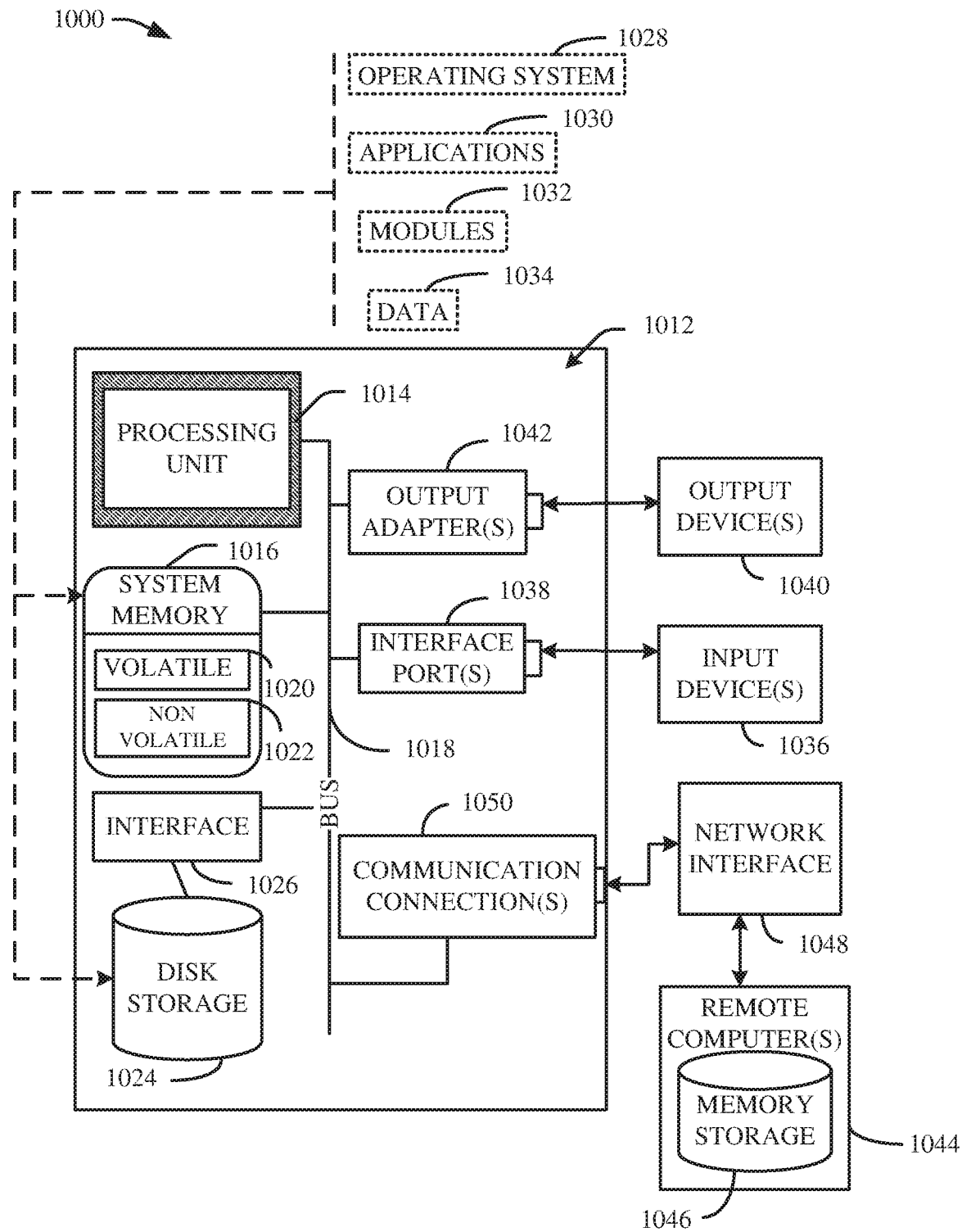
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. For example, operating environment 1000 can be used to implement the example, non-limiting multi-step fabrication operations described herein with reference to FIGS. 1-5 and/or the operations of methods 600, 700, 800, 900 described above with reference to FIGS. 6-9, respectively, which can facilitate implementation of one or more embodiments of the subject disclosure described herein. Repetitive description of like elements and/or processes employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a substrate having an encapsulated vacuum cavity enclosed by a portion of the substrate;
   an epitaxial film located on one or more surfaces of the substrate located within the encapsulated vacuum cavity, wherein the epitaxial film layer seals a port from the encapsulated vacuum cavity through the substrate; and
   a superconducting circuit located within the encapsulated vacuum cavity.

2. The device of claim 1, wherein the substrate comprises a single element semiconductor substrate or a compound semiconductor substrate.

3. The device of claim 1, wherein the epitaxial film comprises a crystalline material film.

4. The device of claim 1, wherein the epitaxial film provided on one or more internal surfaces of the encapsulated vacuum cavity is formed using an epitaxial film growth process.

5. The device of claim 1, wherein the encapsulated vacuum cavity comprises one or more crystalline materials provided on the substrate using at least one epitaxial film growth process.

6. The device of claim 1, wherein the epitaxial film comprises an amorphous free material film.

* * * * *